US011782487B2

(12) United States Patent
Shen et al.

(10) Patent No.: US 11,782,487 B2
(45) Date of Patent: Oct. 10, 2023

(54) FOLDABLE ELECTRONIC DEVICE

(71) Applicant: Acer Incorporated, New Taipei (TW)

(72) Inventors: Chao-Di Shen, New Taipei (TW); Huei-Ting Chuang, New Taipei (TW)

(73) Assignee: ACER INCORPORATED, New Taipei (TW)

( * ) Notice: Subject to any disclaimer, the term of this patent is extended or adjusted under 35 U.S.C. 154(b) by 0 days.

(21) Appl. No.: 17/724,804

(22) Filed: Apr. 20, 2022

(65) Prior Publication Data
US 2022/0342456 A1 Oct. 27, 2022

(30) Foreign Application Priority Data

Apr. 23, 2021 (TW) ................... 110204532

(51) Int. Cl.
*G06F 1/16* (2006.01)
*H05K 5/02* (2006.01)

(52) U.S. Cl.
CPC .......... *G06F 1/1681* (2013.01); *G06F 1/1616* (2013.01); *H05K 5/0221* (2013.01)

(58) Field of Classification Search
None
See application file for complete search history.

(56) References Cited

U.S. PATENT DOCUMENTS

| | | | | |
|---|---|---|---|---|
| 8,416,568 B2* | 4/2013 | Tian | ...................... | G06F 1/1626 361/679.55 |
| 8,599,542 B1* | 12/2013 | Healey | .................. | G06F 1/1626 455/575.8 |
| 9,137,913 B2* | 9/2015 | Hsu | ........................ | G06F 1/1632 |
| 9,201,466 B2* | 12/2015 | Lai | ........................ | G06F 1/1681 |
| 10,852,775 B1* | 12/2020 | Kim | ......................... | E05D 3/02 |
| 2013/0271373 A1* | 10/2013 | Milhe | .................. | G06F 1/1671 345/156 |
| 2014/0063714 A1* | 3/2014 | Chung | .................. | G06F 1/1626 361/679.55 |
| 2014/0071654 A1* | 3/2014 | Chien | .................. | H01H 13/704 362/23.03 |
| 2014/0292646 A1* | 10/2014 | Kawamoto | ........... | G06F 1/1677 345/156 |

* cited by examiner

*Primary Examiner* — Anthony Q Edwards
*Assistant Examiner* — Rashen E Morrison
(74) *Attorney, Agent, or Firm* — McClure, Qualey & Rodack, LLP

(57) ABSTRACT

A foldable electronic device is provided, including an input module, a pivot member, a display module, and a hinge mechanism. The display module is rotatably connected to the pivot member, and the pivot member is rotatably connected to the input module via the hinge mechanism. Specifically, when the display module and the pivot member are unfolded less than a specific angle relative to the input module, a latch of the hinge mechanism is joined in an opening of the display module, so as to prevent rotation of the display module relative to the pivot member.

9 Claims, 17 Drawing Sheets

FOLDABLE ELECTRONIC DEVICE

CROSS REFERENCE TO RELATED APPLICATIONS

This application claims priority of Taiwan Patent Application No. 110204532, filed on Apr. 23, 2021, the entirety of which is incorporated by reference herein.

BACKGROUND OF THE INVENTION

Field of the Invention

The present invention relates to an electronic device, and, in particular, to a foldable electronic device that has a latch mechanism.

Description of the Related Art

FIG. 1 is a schematic diagram of a conventional foldable electronic device 1. FIG. 2 is a schematic diagram of the conventional foldable electronic device 1 in FIG. 1 when the display module 4 and the pivot member 3 have an acute angle relative to the input module 2.

Referring to FIGS. 1 and 2, the conventional foldable electronic device 1 may be a laptop computer that includes an input module 2, a pivot member 3, and a display module 4. The pivot member 3 and the display module 4 are pivotally connected to each other via a hinge H, and the pivot member 3 is further hinged to the input module 2. When the display module 4 and the pivot member 3 have an acute angle relative to the input module 2, as shown in FIG. 2, the display module 4 may rotate relative to the pivot member 3 by gravity. In this state, the display module 4 may collide with the input module 2 and cause mechanical failure in the electronic device 1. Therefore, addressing the problems of the conventional electronic device 1 has become a challenge.

BRIEF SUMMARY OF THE INVENTION

An embodiment of the present invention provides a foldable electronic device that includes an input module, a display module, a pivot member, and a hinge mechanism. The display module has an opening. The pivot member is, pivotally connected to the display module. The hinge mechanism is pivotally connected to the input module and the pivot module and has a first hinge, a second hinge, a slider, a fixed assembly, a plurality of gears, and a latch.

The second hinge has a central axis, the fixed assembly is affixed to the pivot member, the first and second hinges extend through the fixed assembly, the slider is connected to the second hinge and the latch, and the gears are engaged with the first and second hinges.

In some embodiments, when the foldable electronic device is in a closed state, the input module, the display module, and the pivot member are parallel to each other, and the latch is joined in the opening to prevent the display module from rotating relative to the pivot member.

In some embodiments, when the display module and the pivot member are unfolded over a specific angle relative to the input module, the second hinge and the fixed assembly rotate around the first hinge, the second hinge is driven by the gears to rotate around the central axis, and the slider is forced by the second hinge to move and impel the latch to release from the opening. In this manner, the display module is rotatable relative to the pivot member.

In some embodiments, the foldable electronic device further includes a resilient member disposed on the fixed assembly and connected to the slider, wherein when the display module and the pivot member are unfolded over a specific angle relative to the input module, the resilient member exerts a spring force on the latch to move relative to the pivot member and release from the opening.

In some embodiments, the latch is pivotally connected to the fixed assembly and has a C-shaped structure.

In some embodiments, the latch is pivotally connected to the fixed assembly and has a slot, and one end of the resilient member is received in the slot.

In some embodiments, the resilient member is a torsional spring.

In some embodiments, the slider has a protrusion, and a curved recess is formed on an outer surface of the second hinge, wherein the protrusion is slidably received in the curved recess.

In some embodiments, the foldable electronic device further includes a rod and a connecting member, wherein the rod extends through the slider, and the connecting member is connected to the rod and the second hinge.

In some embodiments, when the display module and the pivot member are unfolded over a specific angle relative to the input module from the closed state, the second hinge rotates around the central axis, and the protrusion slides along the curved recess and impels the slider to move along the rod.

In some embodiments, the specific angle is between 30 and 90 degrees.

In some embodiments, the foldable electronic device is a laptop computer.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The making and using of the embodiments of the foldable electronic device and hinge mechanism are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure.

Unless defined otherwise, all technical and scientific terms used herein have the same meaning as commonly understood by one of ordinary skill in the art to which this invention belongs. It should be appreciated that each term, which is defined in a commonly used dictionary, should be interpreted as having a meaning conforming to the relative skills and the background or the context of the present disclosure, and should not be interpreted in an idealized or overly formal manner unless defined otherwise.

In the following detailed description of the preferred embodiments, reference is made to the accompanying drawings, and in which specific embodiments of which the invention may be practiced are shown by way of illustration. In this regard, directional terminology, such as "top," "bottom," "left," "right," "front," "back," etc., is used with reference to the orientation of the figures being described. The components of the present invention can be positioned in a number of different orientations. As such, the directional terminology is used for the purposes of illustration and is in no way limiting.

Figure 1:
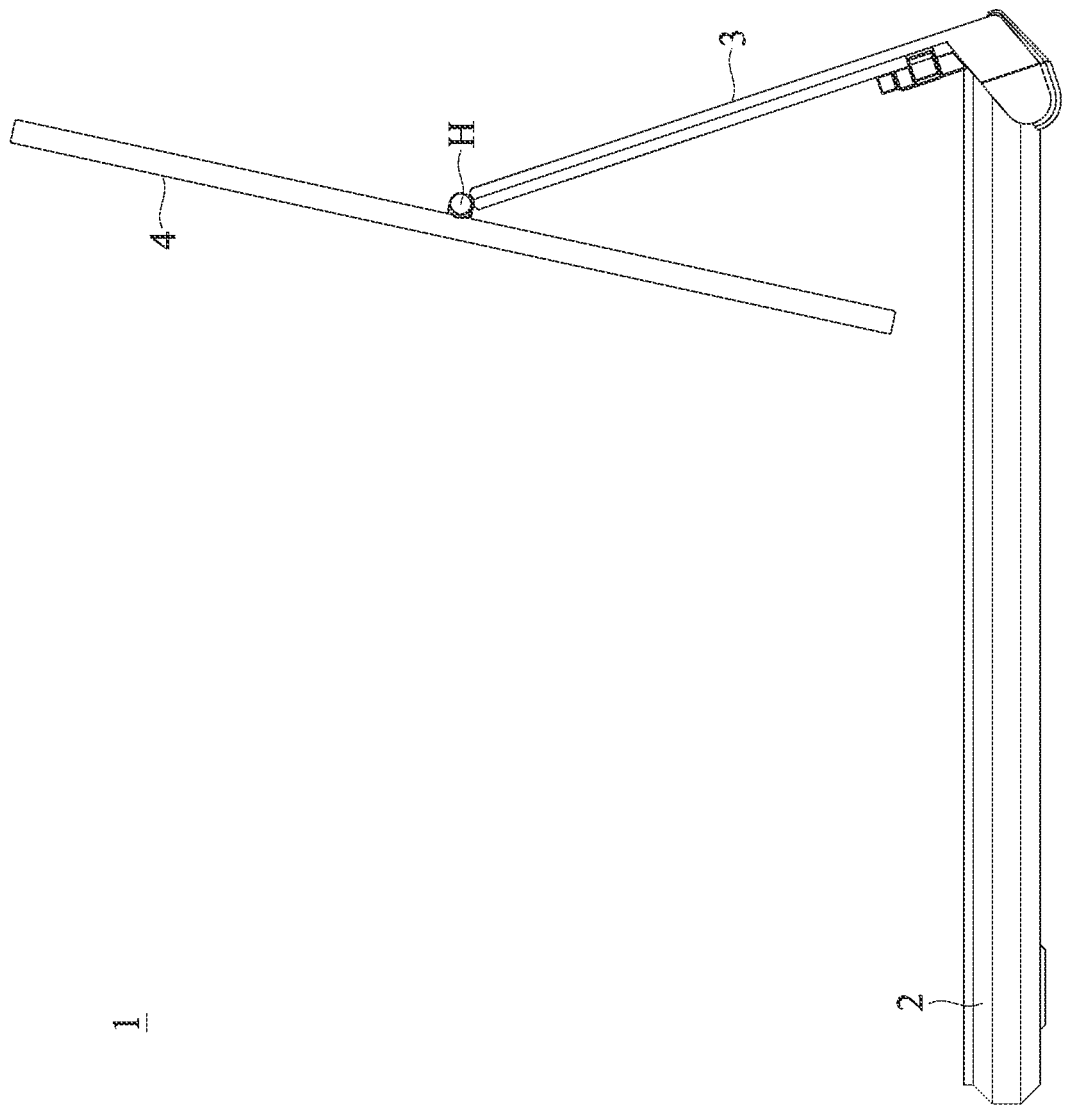
FIG. 1 is a schematic diagram of a conventional foldable electronic device 1.
Figure 2:
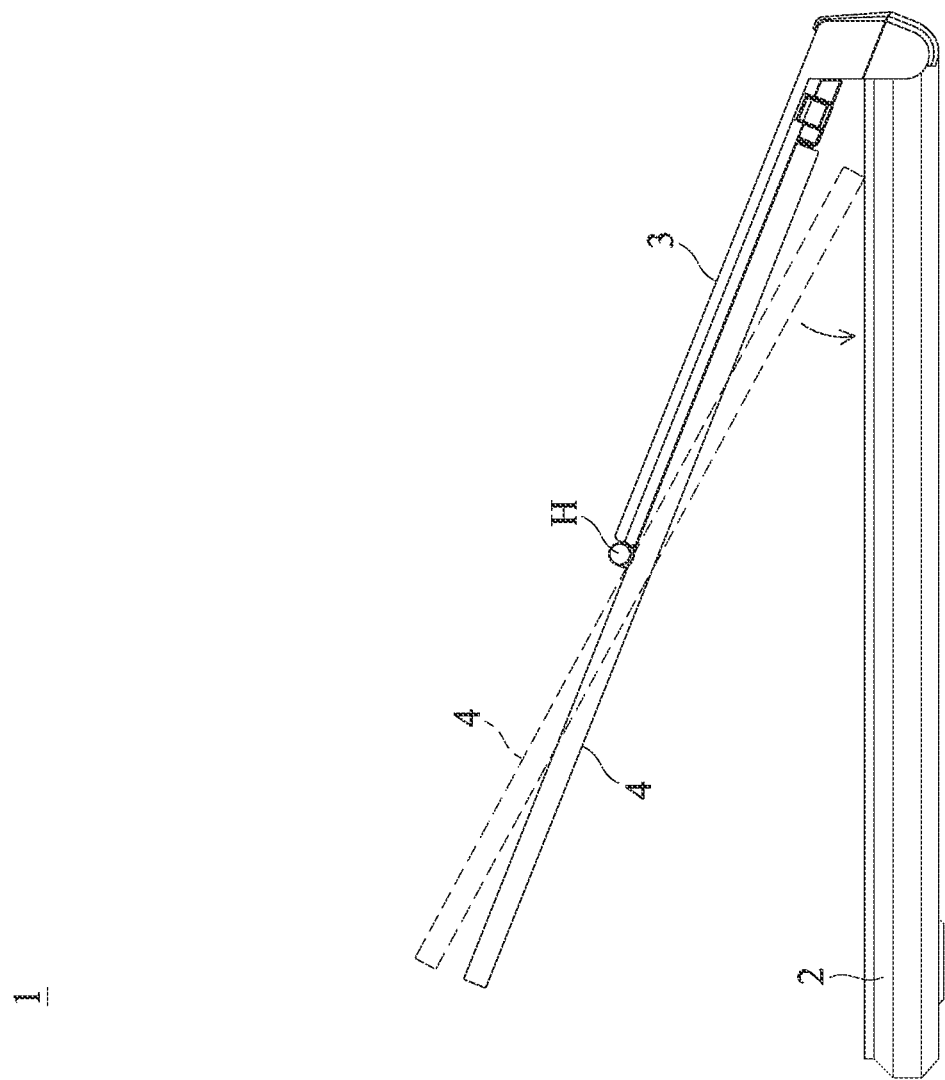
FIG. 2 is a schematic diagram of the conventional foldable electronic device 1 in FIG. 1 when the display module 4 and the pivot member 3 have an acute angle relative to the input module 2.
Figure 3:
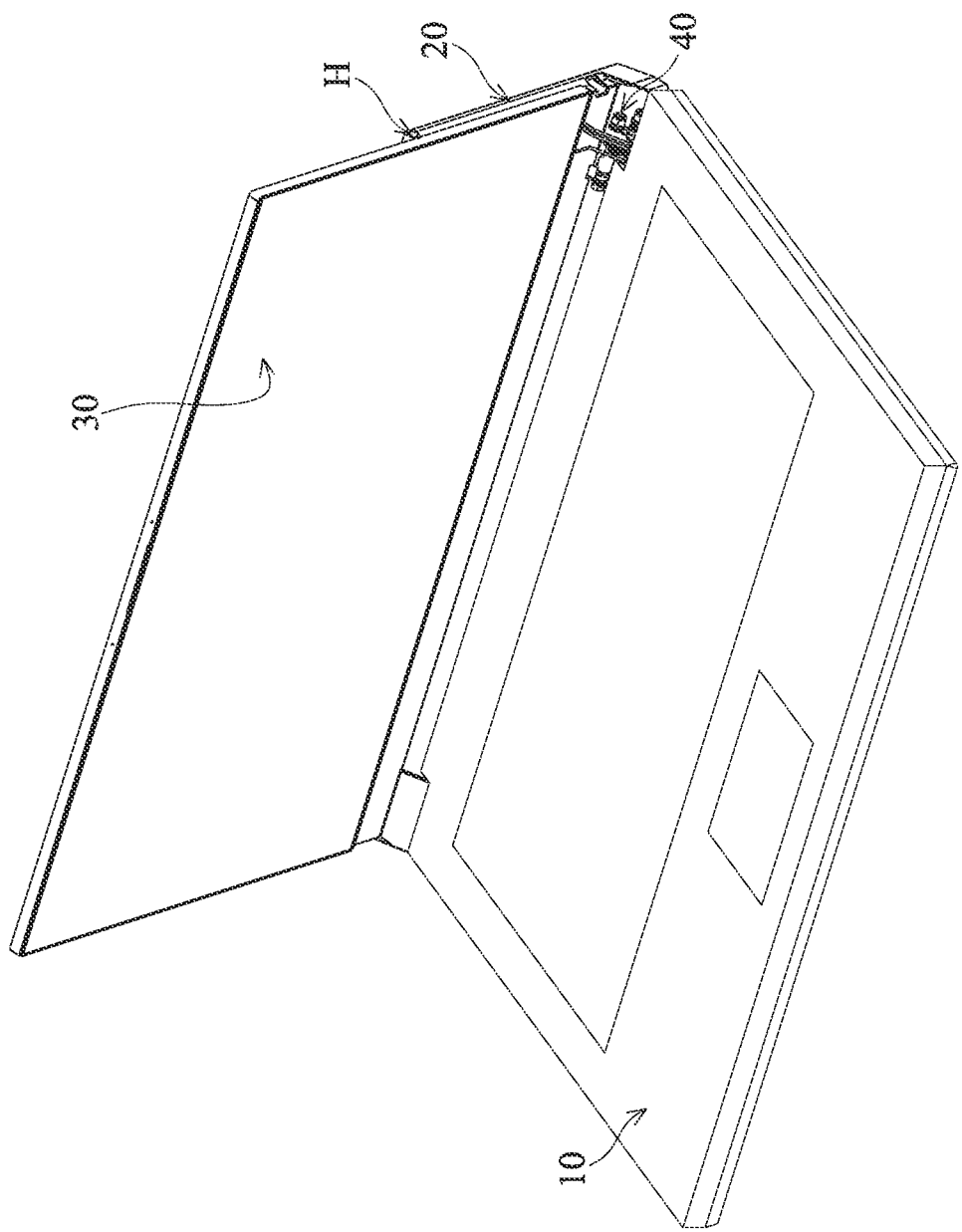
FIG. 3 is a perspective diagram of a foldable electronic device 100, in accordance with an embodiment of the invention.
Figure 4:
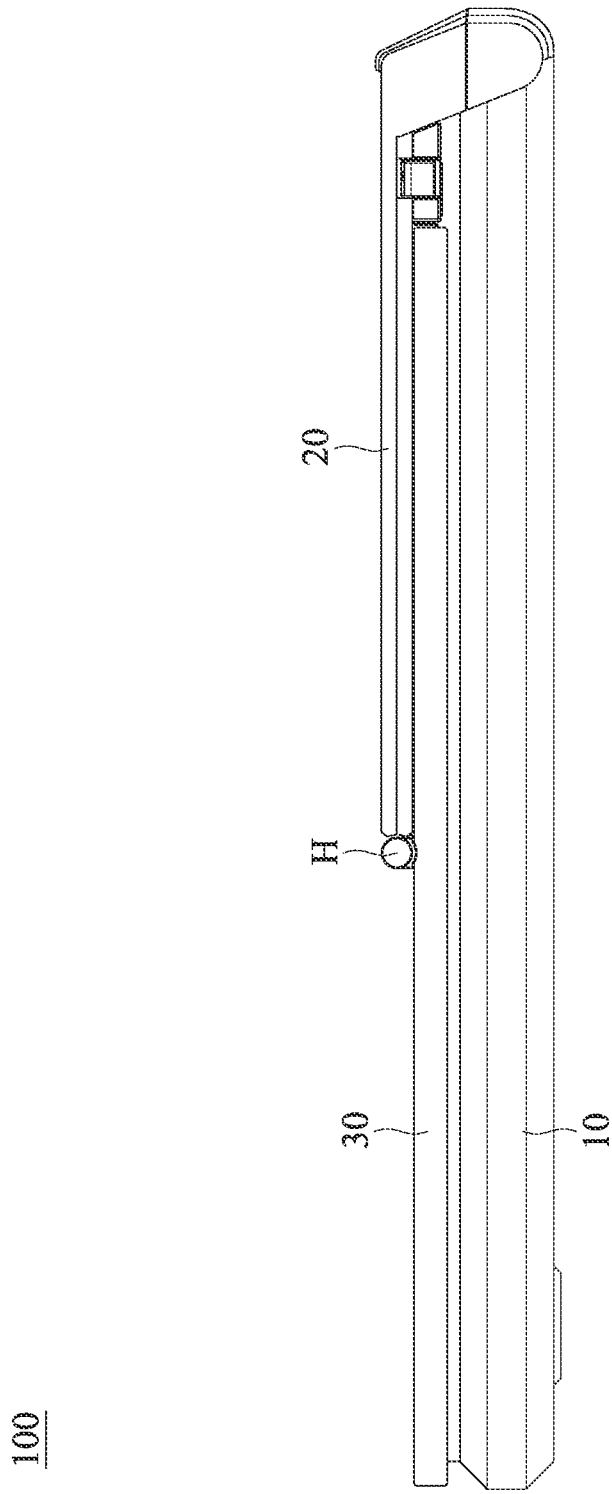
FIG. 4 is a side view of the foldable electronic device 100 when in a closed state.
Figure 5:
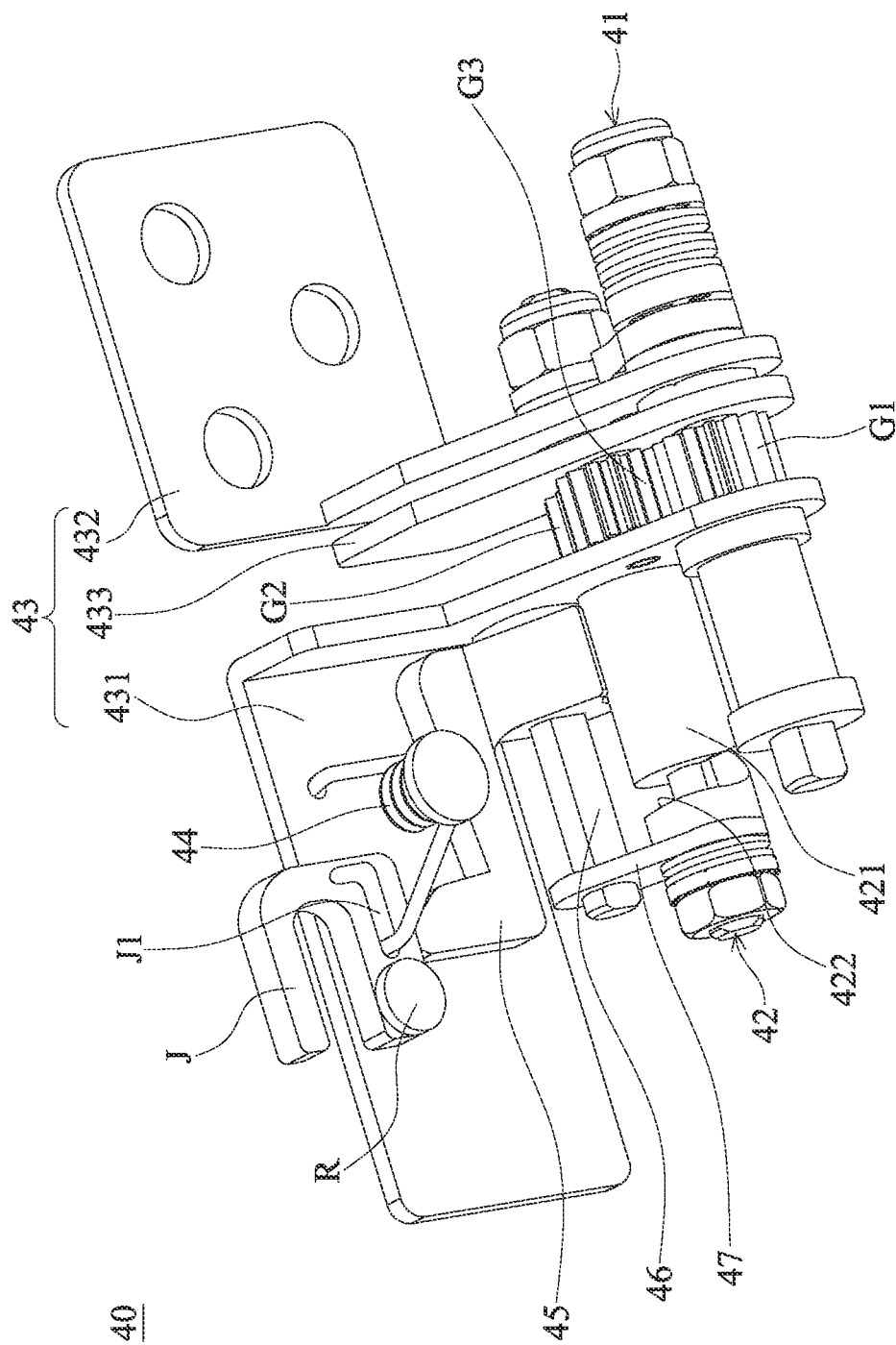
FIG. 5 is a perspective diagram of the hinge mechanism 40 in the pivot member 20 of FIG. 4 when the foldable electronic device 100 is in the closed state.

FIG. 3 is a perspective diagram of a foldable electronic device 100, in accordance with an embodiment of the invention. FIG. 4 is a side view of the foldable electronic device 100 when in a closed state. FIG. 5 is a perspective diagram of the hinge mechanism 40 in the pivot member 20 of FIG. 4 when the foldable electronic device 100 is in the closed state.

As shown in FIGS. 3 and 4, the foldable electronic device 100 may be a laptop computer that primarily comprises an input module 10, a pivot member 20, a display module 30, and a hinge mechanism 40 disposed in the pivot member 20. The input module 10 and the pivot member 20 are pivotally connected to each other via the hinge mechanism 40. The pivot member 20 and the display module 30 are pivotally connected to each other via the hinge H. Therefore, the display module 30 can rotate relative to the pivot member 20, and the pivot member 20 can rotate relative to the input module 10.

In this embodiment, a screen (e.g. LCD, OLED or touch screen) is formed on the display module 30. Moreover, a keyboard (e.g. QWERTY keyboard) and/or a touch pad may be provided on the surface of the input module 10. It should be noted that the keyboard and/or the touch pad can be used as a user input interface, whereby the user can easily use the electronic device 100.

When the display module 30 of the electronic device 100 is in the closed state, the input module 10, the pivot member 20, and the display module 30 are parallel to each other. When using the electronic device 100, the pivot member 20 and the display module 30 can be unfolded with respect to the input module 10, so that the user can watch the screen on the display module 30, and he or she can also input instructions or control the mouse cursor on the screen of the display module 30 via the keyboard or touchpad.

It should be noted that when the display module 30 and the pivot member 20 are unfolded relative to the input module 10 less than a specific angle, a latch J in the hinge mechanism 40 is joined in an opening 31 (FIG. 8) of the display module 30, whereby the display module 30 would not rotate relative to the pivot member 20 by gravity and collide with the input module 10.

However, when the display module 30 and the pivot member 20 rotate relative to the input module 10 over a specific angle, the latch J in the hinge mechanism 40 is released from the opening 31 (FIG. 17) of the display module 30, whereby the display module 30 can rotate freely relative to the pivot member 20 (FIG. 14) without collision with the input module 10.

Figure 6:
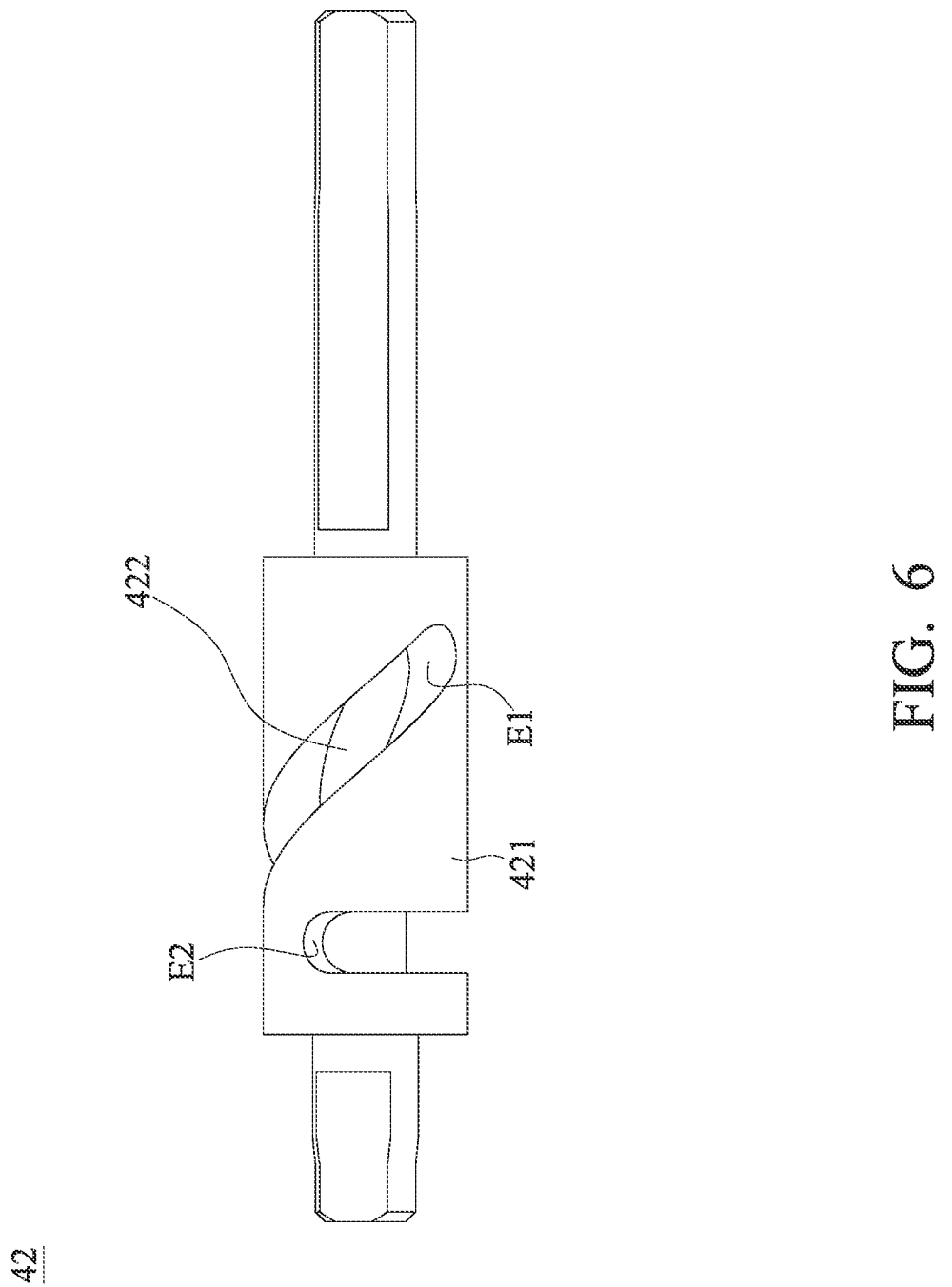
FIG. 6 is a side view of the second hinge 42 in FIG. 5.
Figure 7:
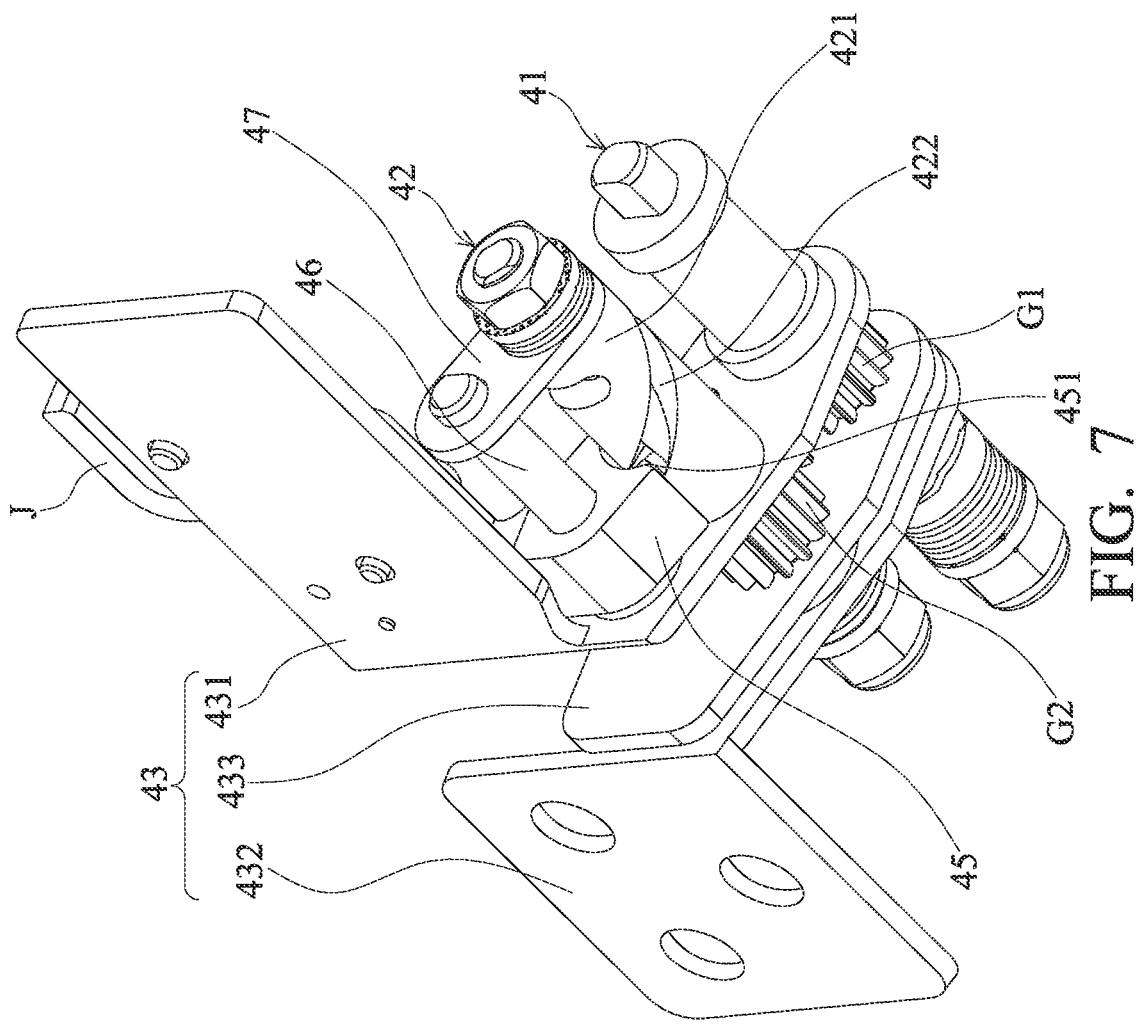
FIG. 7 is another perspective diagram of the hinge mechanism 40 in FIG. 5.
Figure 8:
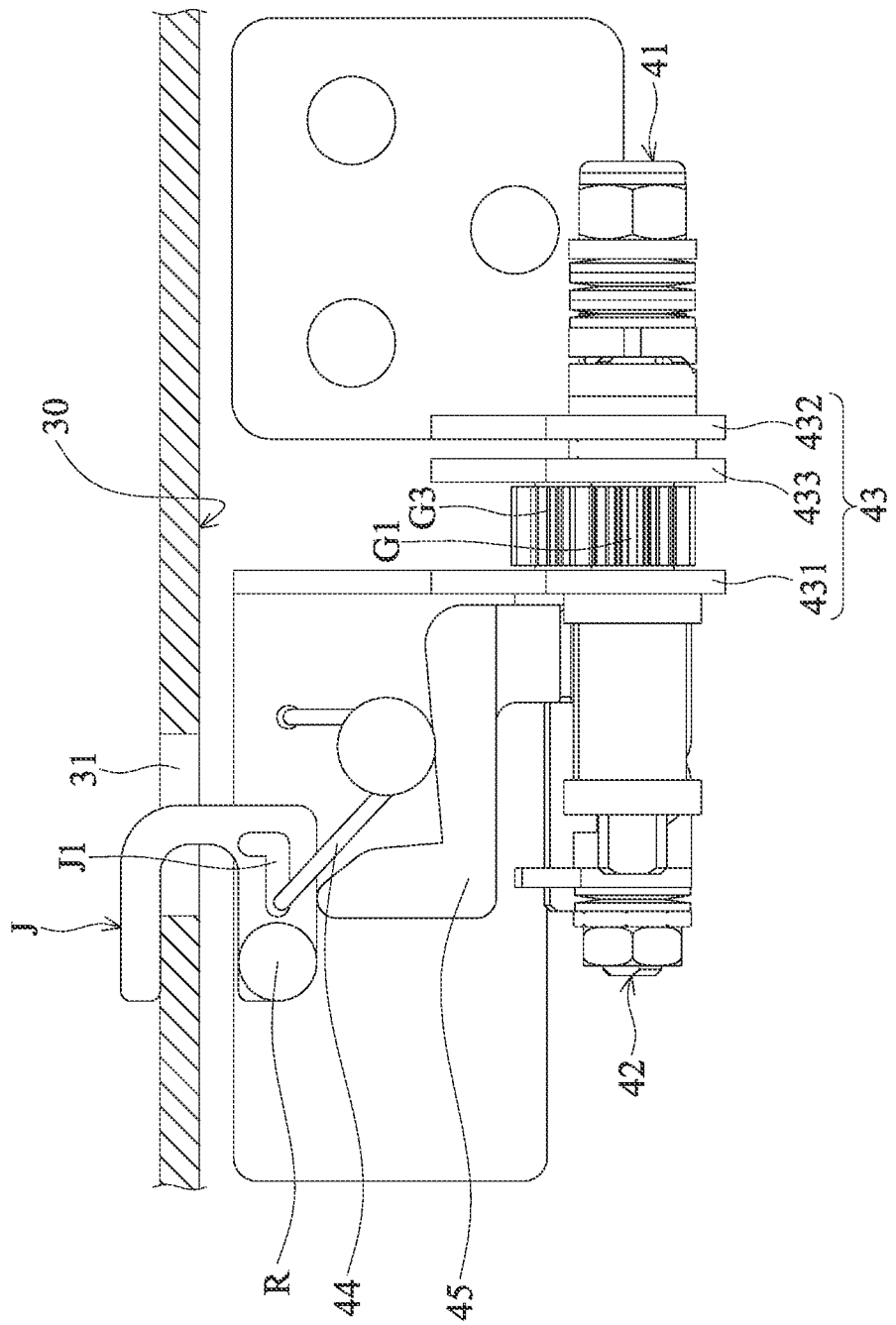
FIG. 8 is a cross-sectional view showing the latch J of the hinge mechanism 40 when joined in the opening 31 of the display module 30.
Figure 9:
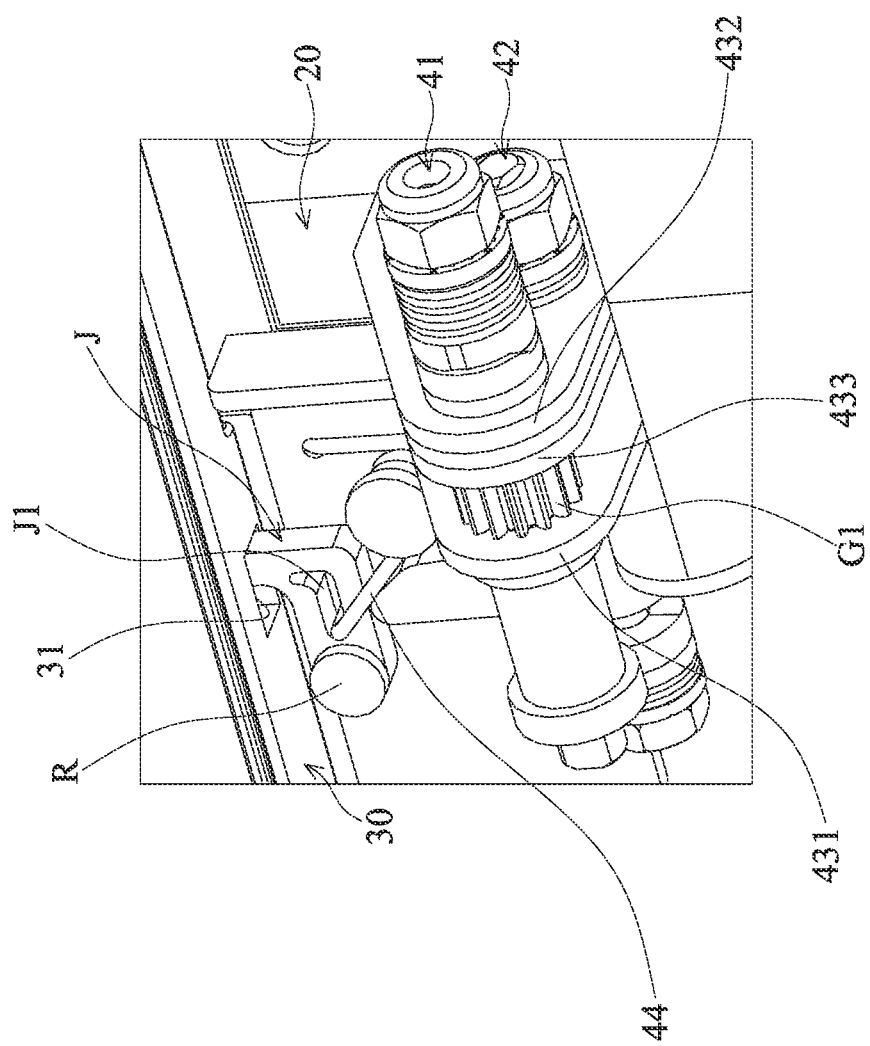
FIG. 9 is a perspective diagram showing the latch J of the hinge mechanism 40 when joined in the opening 31 of the display module 30.

FIG. 6 is a side view of the second hinge 42 in FIG. 5. FIG. 7 is another perspective diagram of the hinge mechanism 40 in FIG. 5. FIG. 8 is a cross-sectional view showing the latch J of the hinge mechanism 40 when joined in the opening 31 of the display module 30. FIG. 9 is a perspective diagram showing the latch J of the hinge mechanism 40 when joined in the opening 31 of the display module 30.

Referring to FIGS. 4-9, when the foldable electronic device 100 is in the closed stated of FIG. 4, the input module 10, the pivot member 20, and the display module 30 are parallel to each other, and the hinge mechanism 40 is in the state as shown in FIGS. 5 and 7-9. In this embodiment, the hinge mechanism 40 comprises a first hinge 41, a second hinge 42, a fixed assembly 43, a resilient member 44, a slider 45, a longitudinal rod 46, a connecting member 47, and a C-shaped latch J.

The first hinge 41 is affixed to the input module 10, the second hinge 42 is disposed in the pivot member 20, and the fixed assembly is affixed to the pivot member 20. The first and second hinges 41 and 42 are connected to each other via the gears G1, G2, and G3, wherein the gear G1 is affixed to the first hinge 41, the gear G2 is affixed to the second hinge 42, and the gear G3 is connected between the gears G1 and G2.

Here, the fixed assembly 43 has three flat parts 431, 432, and 433, wherein several friction washers are disposed on the first and second hinges 41 and 42 to provide appropriate resistant torque during rotation between the pivot member 20 and the input module 10. Moreover, as shown in FIGS. 5, 7, 8, and 9, the resilient member 44 may be a torsion spring that is disposed on the flat part 431, and the latch J is pivotally connected to the flat part 431 via a hinge R, wherein the end of the resilient member 44 is slidably received in a slot J1 of the latch J.

The rod 46 extends through the slider 45 (FIG. 5), and the connecting member 47 connects to the rod 46 and the second hinge 42. As shown in FIGS. 5-7, the second hinge 42 has a cylindrical structure, and a curved recess 422 is formed on the outer surface 421 of the second hinge 42. When the electronic device 100 is in the closed state of FIG. 4, a protrusion 451 of the slider 45 (FIG. 7) is located in a first end E1 o the recess 422.

When the pivot member 20 and the display module 30 are unfolded with respect to the input module 10 from the closed state of FIG. 4, the second hinge 42 and the fixed assembly 43 are forced to rotate around the first hinge 41, and the second hinge 42 are driven by the gears G1, G2, and G3 to rotate around its central axis. Meanwhile, the protrusion 451 of the slider 45 slides along the recess 422 and impels the slider 45 along the rod 46, whereby the latch J is forced by the resilient member 44 to rotate around the hinge R and then release from the opening 31 of the display module 30.

Figure 10:
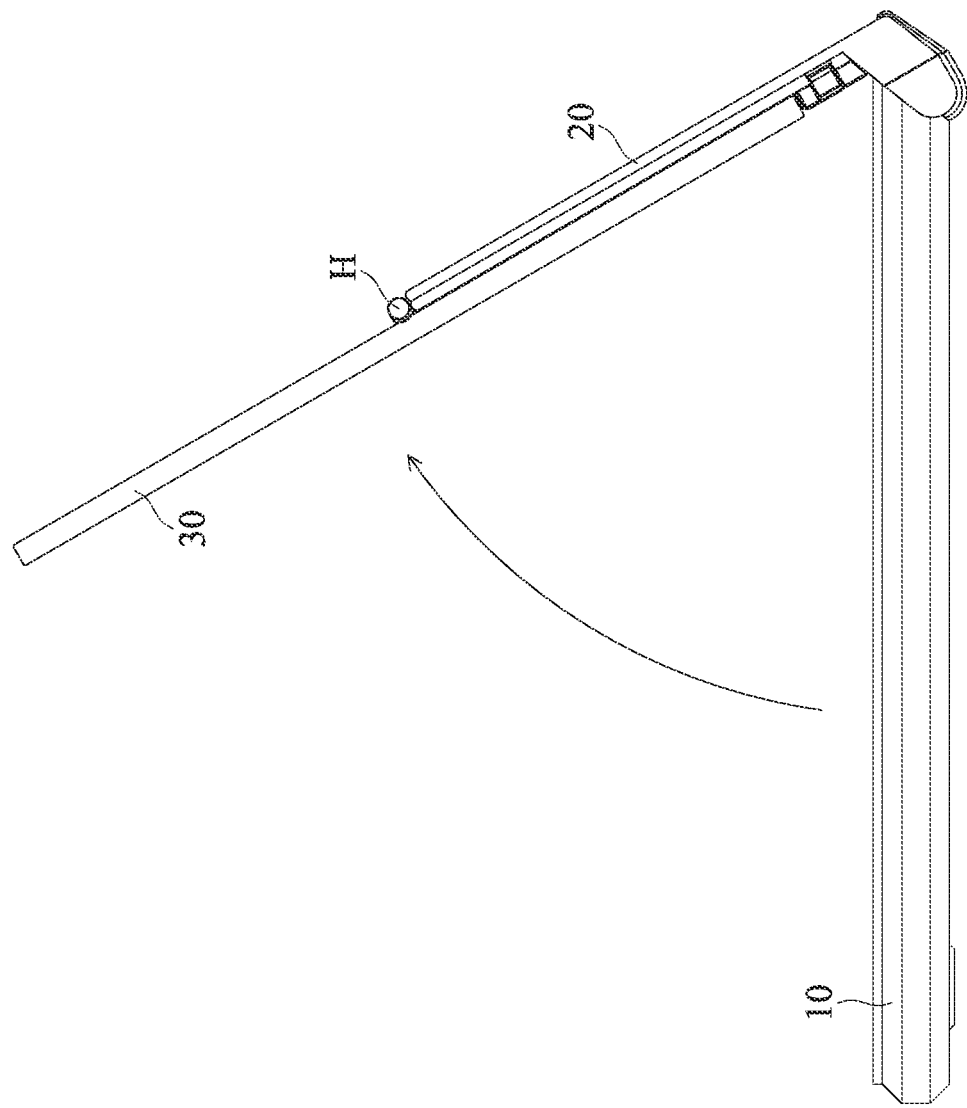
FIG. 10 is a schematic diagram showing the pivot member 20 and the display module 30 unfolded relative to the input module 10 to a transitional angle.
Figure 11:
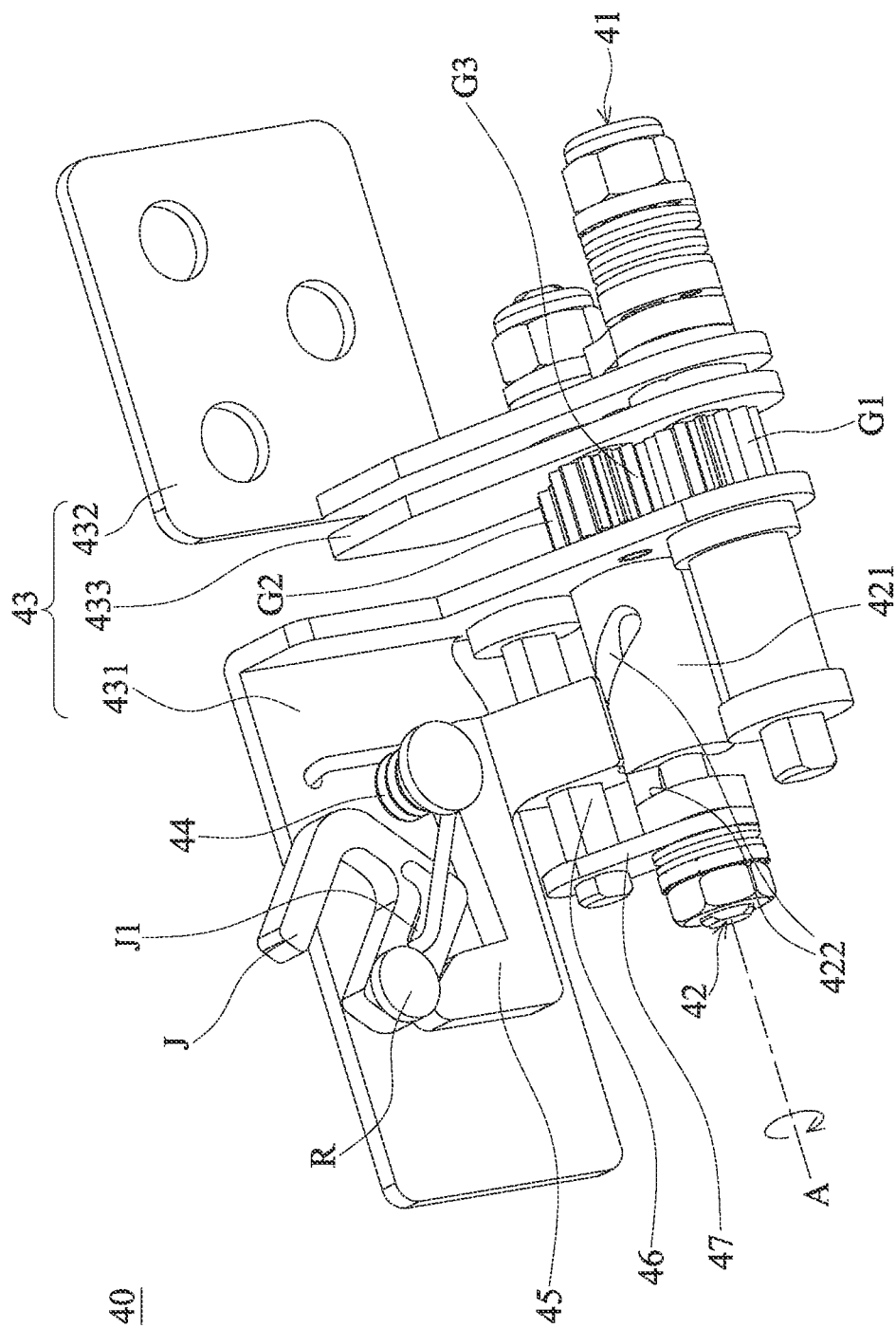
FIG. 11 is a perspective diagram showing the hinge mechanism 40 in the pivot member 20 when the pivot member 20 and the display module 30 are unfolded relative to the input module 10 to the transitional angle of FIG. 10.
Figure 12:
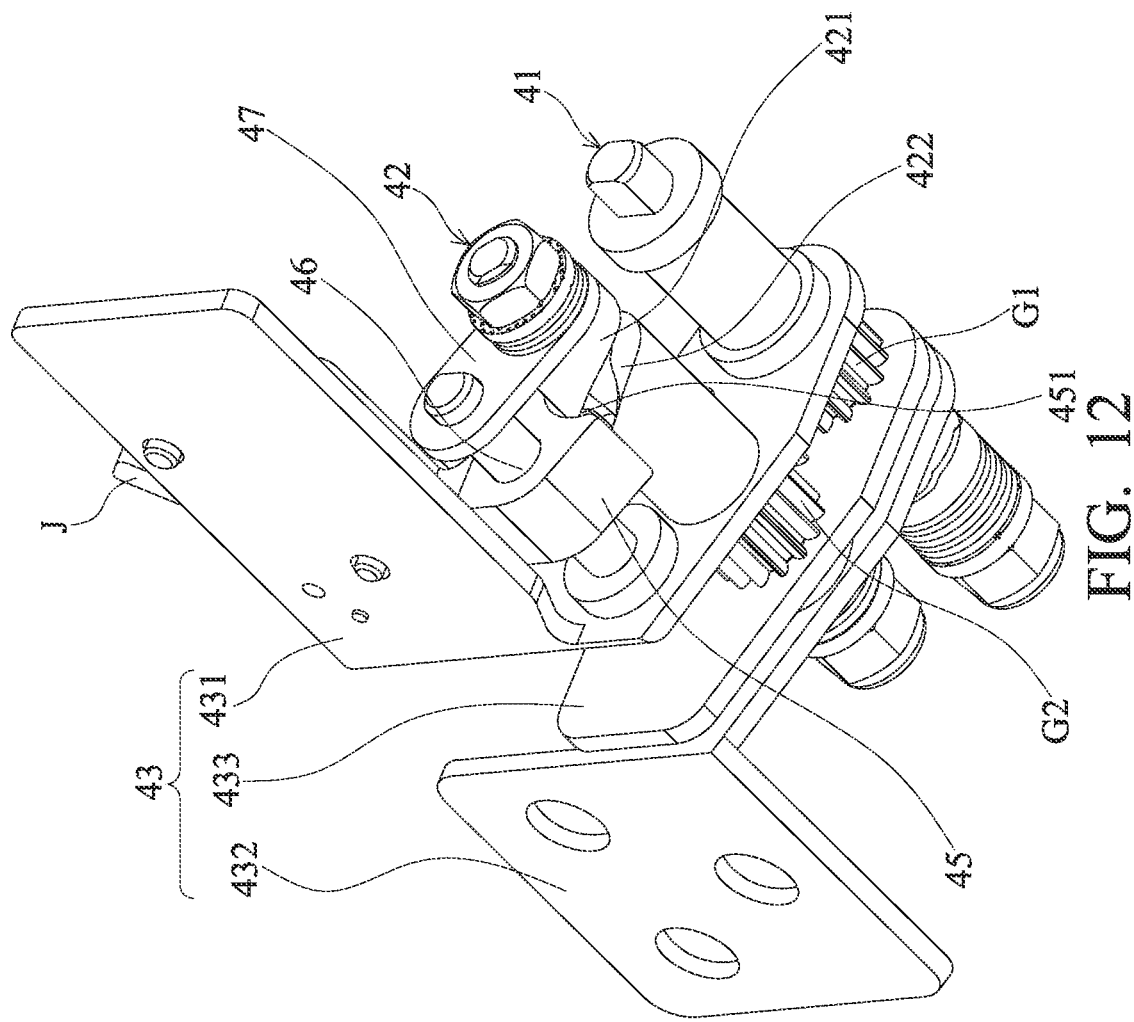
FIG. 12 is another perspective diagram showing the hinge mechanism 40 of FIG. 11.
Figure 13:
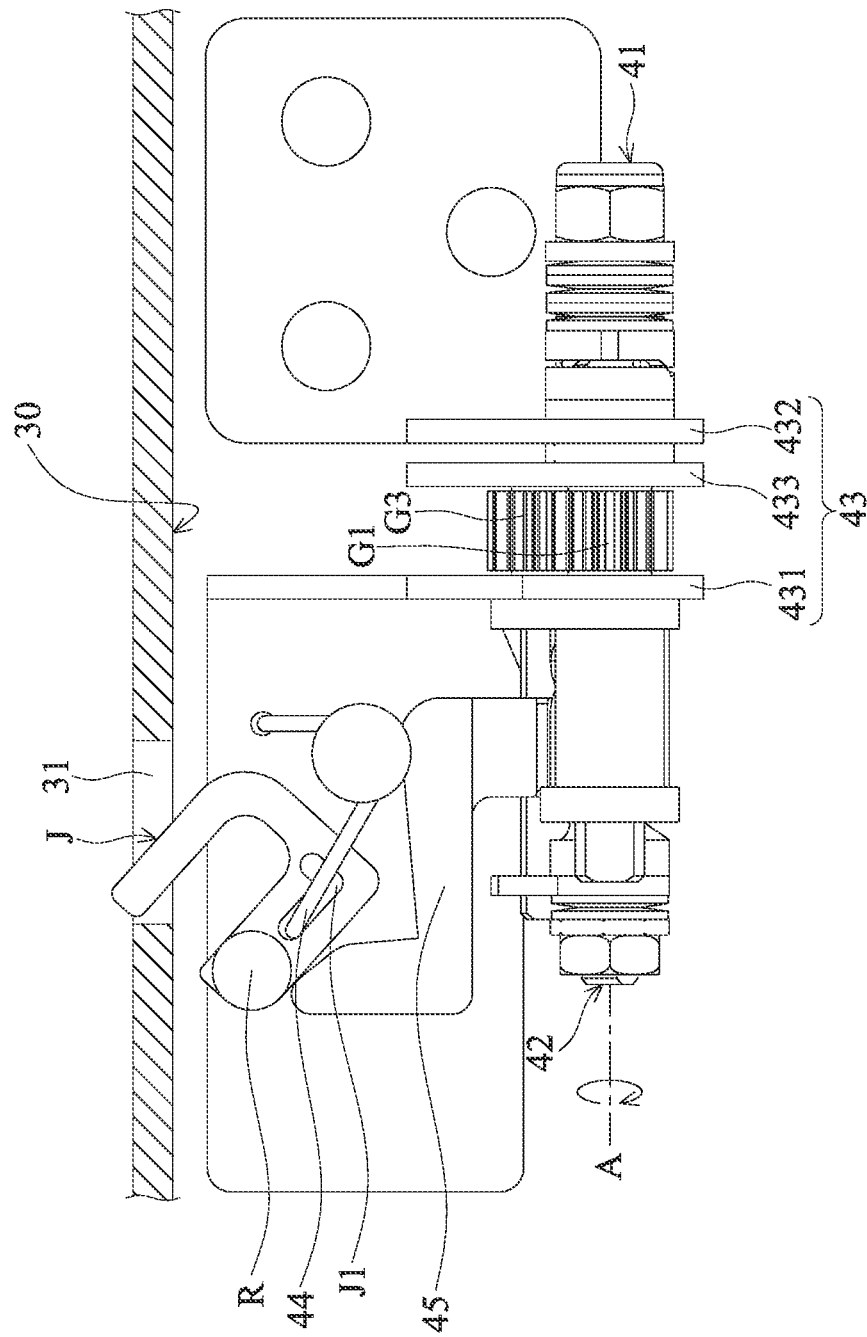
FIG. 13 is a cross-sectional view showing the latch J of the hinge mechanism 40 that is angled relative to the opening 31 of the display module 30.

FIG. 10 is a schematic diagram showing the pivot member 20 and the display module 30 unfolded relative to the input module 10 to a transitional angle. FIG. 11 is a perspective diagram showing the hinge mechanism 40 in the pivot member 20 when the pivot member 20 and the display module 30 are unfolded relative to the input module 10 to the transitional angle of FIG. 10. FIG. 12 is another perspective diagram showing the hinge mechanism 40 of FIG. 11. FIG. 13 is a cross-sectional view showing the latch J of the hinge mechanism 40 that is angled relative to the opening 31 of the display module 30.

Referring to FIGS. 11-13, when the pivot member 20 and the display module 30 are unfolded relative to the input module 10 from the state of FIG. 4 to a transitional angle (FIG. 10), the second hinge 42 and the fixed assembly 43 are forced to rotate around the first hinge 41, and the second hinge 42 are driven by the gears G1, G2, and G3 to rotate around its central axis A, as the arrow indicates in FIG. 11. Meanwhile, the protrusion 451 of the slider 45 slides from the first end E1 (FIG. 6) along the recess 422 to a middle position (FIGS. 11 and 12) and impels the slider 45 along the rod 46, whereby the latch J can be forced by the resilient member 44 to rotate around the hinge R.

While the second hinge 42 rotates around its central axis A and impels the slider 45 to slide along the rod 46, as shown in FIGS. 11-13, the latch J can rotate around the hinge R to be angled relative to the opening 31. In this state, since the latch J is not completely released from the opening 31, the display module 30 cannot rotate freely relative to the pivot member 20. Therefore, the collision of the display module 30 and the input module 10 due to the rotation of the display module 30 relative to the pivot member 20 can be efficiently avoided.

Figure 14:
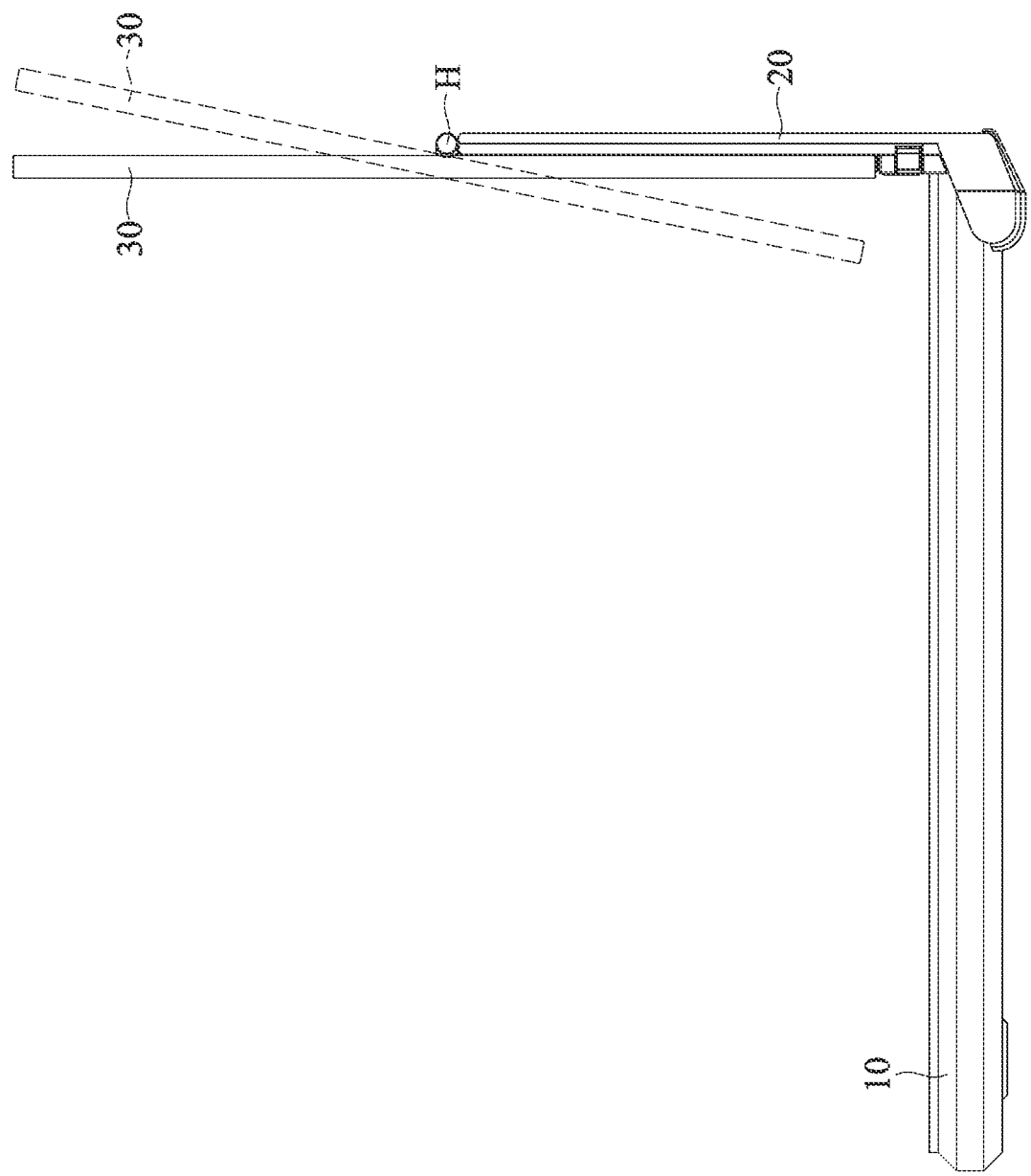
FIG. 14 is a schematic diagram showing the pivot member 20 and the display module 30 unfolded relative to the input module 10 to an open position.
Figure 15:
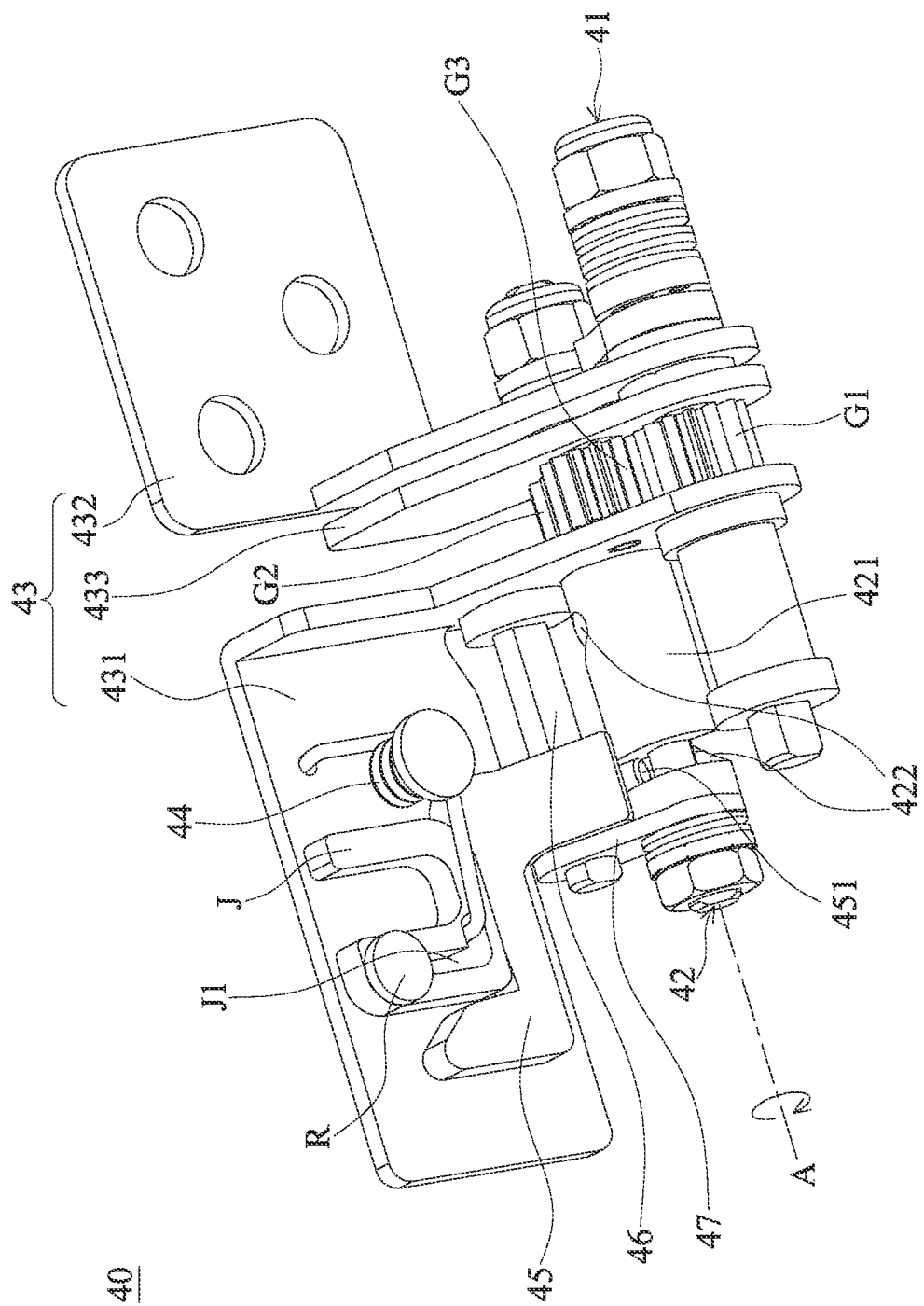
FIG. 15 is a perspective diagram showing the hinge mechanism 40 when the pivot member 20 and the display module 30 are unfolded relative to the input module 10 to the open position of FIG. 14.
Figure 16:
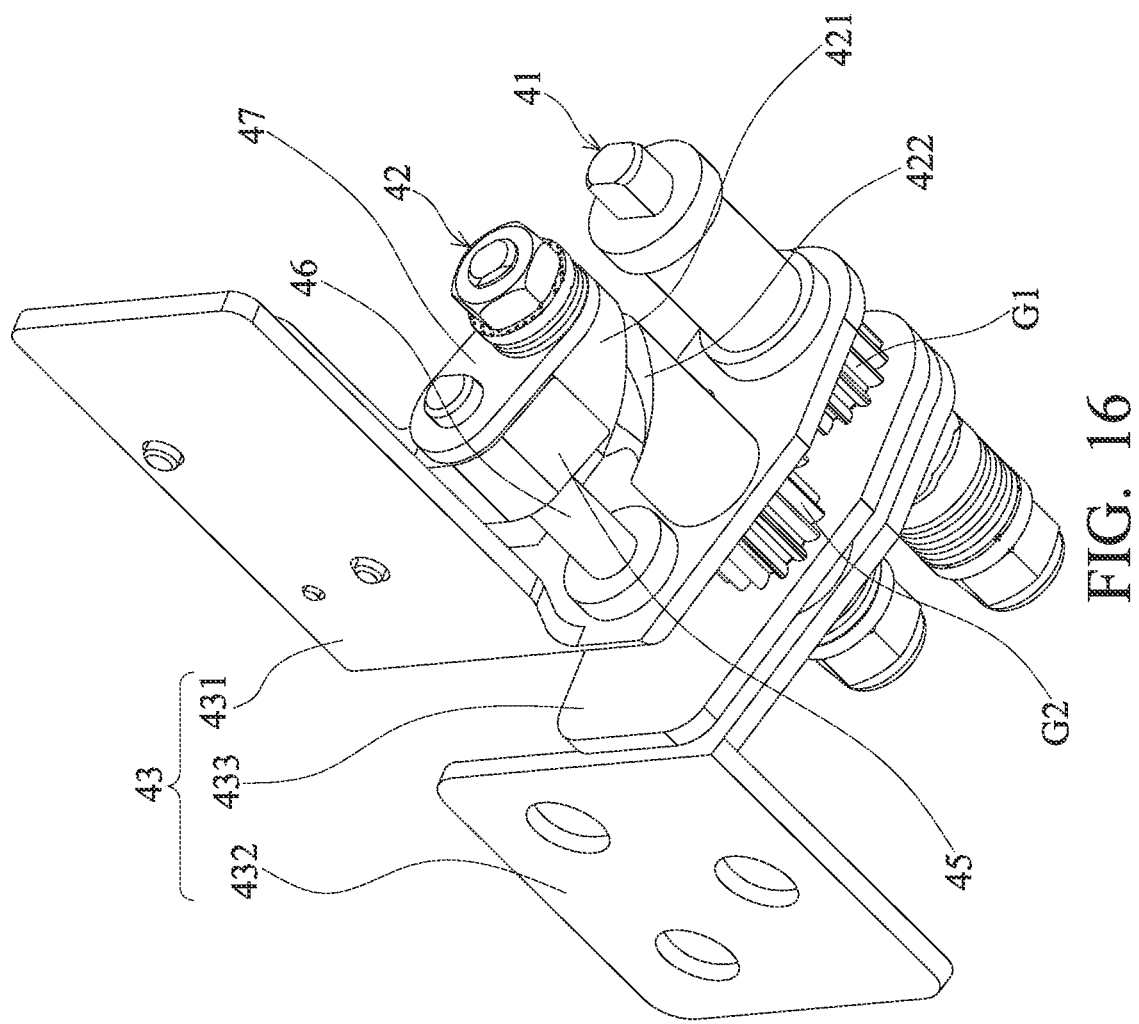
FIG. 16 is another perspective diagram showing the hinge mechanism 40 of FIG. 15.
Figure 17:
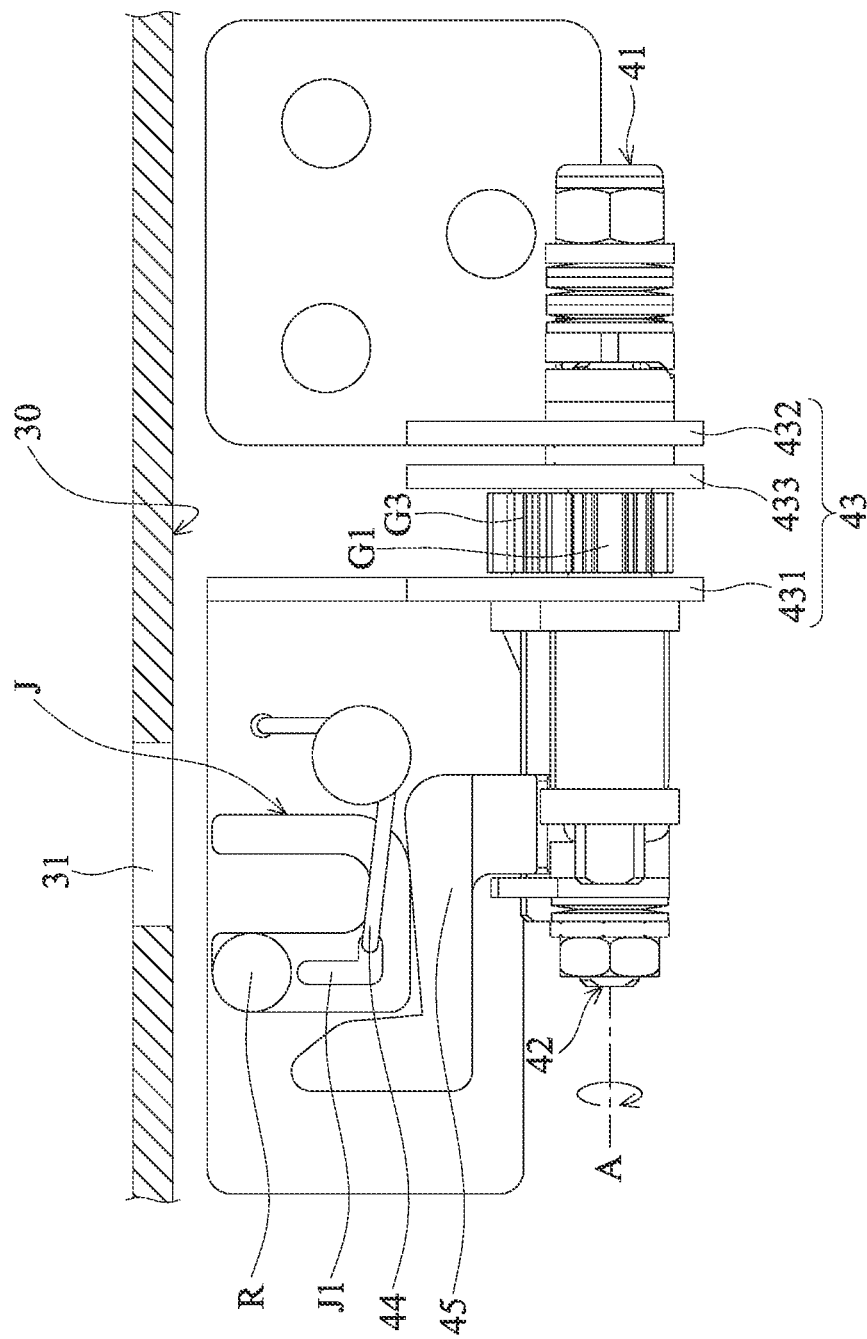
FIG. 17 is a cross-sectional view showing the latch J of the hinge mechanism 40 that is released from the opening 31 of the display module 30.

FIG. 14 is a schematic diagram showing the pivot member 20 and the display module 30 unfolded relative to the input module 10 to an open position. FIG. 15 is a perspective diagram showing the hinge mechanism 40 when the pivot member 20 and the display module 30 are unfolded relative to the input module 10 to the open position of FIG. 14. FIG. 16 is another perspective diagram showing the hinge mechanism 40 of FIG. 15. FIG. 17 is a cross-sectional view showing the latch J of the hinge mechanism 40 that is released from the opening 31 of the display module 30.

Referring to FIGS. 14-17, when the pivot member 20 and the display module 30 are further unfolded relative to the input module 10 from the state of FIG. 10 to an open position (FIG. 14), the second hinge 42 and the fixed assembly 43 are forced to rotate around the first hinge 41, and the second hinge 42 are driven by the gears G1, G2, and G3 to rotate around its central axis A, as the arrow indicates in FIG. 15. Meanwhile, the protrusion 451 of the slider 45 slides from the middle position (FIGS. 11 and 12) along the recess 422 to a second end E2 (FIGS. 6 and 15) and impels the slider 45 along the rod 46. Thus, the latch J can be forced by the resilient member 44 to rotate around the hinge R and then completely release from the opening 31, and the display module 30 can rotate freely relative to the pivot member 20 (FIG. 14).

As mentioned above, when the display module 30 and the pivot member 20 rotate relative to the input module 10 over a specific angle, the latch J is released from the opening 31 (FIG. 17) of the display module 30, whereby the display module 30 can rotate freely relative to the pivot member 20 (FIG. 14) without collision with the input module 10. In this embodiment, the specific angle is between 30 and 90 degrees. The angle of 60 to 90 degrees may be preferable, but it is not so limited in the embodiments of the invention.

In some embodiments, the slider 45 may directly connect to the latch J without the resilient member 44. For example, one end of the slider 45 may be pivotally received in the slot J1 of the latch J, whereby the latch J can rotate between the joined state of FIG. 8 and the released state of FIG. 17.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, compositions of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. Moreover, the scope of the appended claims should be accorded the broadest interpretation so as to encompass all such modifications and similar arrangements.

While the invention has been described by way of example and in terms of preferred embodiment, it should be understood that the invention is not limited thereto. On the contrary, it is intended to cover various modifications and similar arrangements (as would be apparent to those skilled in the art). Therefore, the scope of the appended claims should be accorded the broadest interpretation to encompass all such modifications and similar arrangements.

What is claimed is:

1. A foldable electronic device, comprising:
   an input module;
   a display module, having an opening;
   a pivot member, pivotally connected to the display module;
   a hinge mechanism, pivotally connected to the input module and the pivot member, having a first hinge, a second hinge, a slider, a fixed assembly, a plurality of gears, and a latch, wherein the second hinge has a central axis, the fixed assembly is affixed to the pivot member, the first and second hinges extend through the fixed assembly, the slider is connected to the second hinge and the latch, and the gears are engaged with the first and second hinges; and a resilient member, disposed on the fixed assembly and connected to the slider, wherein when the display module and the pivot member are unfolded over the specific angle relative to the input module, the resilient member exerts a spring force on the latch to move relative to the pivot member and release from the opening;

wherein when the foldable electronic device is in a closed state, the input module, the display module, and the pivot member are parallel to each other, and the latch is joined in the opening to prevent the display module from rotating relative to the pivot member;

wherein when the display module and the pivot member are unfolded over a specific angle relative to the input module, the second hinge and the fixed assembly rotate around the first hinge, the second hinge is driven by the gears to rotate around the central axis, and the slider is forced by the second hinge to move and impel the latch to release from the opening, whereby the display module is rotatable relative to the pivot member.

2. The foldable electronic device as claimed in claim 1, wherein the latch is pivotally connected to the fixed assembly and has a C-shaped structure.

3. The foldable electronic device as claimed in claim 1, wherein the latch is pivotally connected to the fixed assembly and has a slot, and an end of the resilient member is received in the slot.

4. The foldable electronic device as claimed in claim 1, wherein the resilient member comprises a torsional spring.

5. The foldable electronic device as claimed in claim 1, wherein the specific angle is between 30 and 90 degrees.

6. The foldable electronic device as claimed in claim 1, wherein the foldable electronic device comprises a laptop computer.

7. A foldable electronic device, comprising:
an input module;
a display module, having an opening;
a pivot member, pivotally connected to the display module;
a hinge mechanism, pivotally connected to the input module and the pivot member, having a first hinge, a second hinge, a slider, a fixed assembly, a plurality of gears, and a latch, wherein the second hinge has a central axis, the fixed assembly is affixed to the pivot member, the first and second hinges extend through the fixed assembly, the slider is connected to the second hinge and the latch, and the gears are engaged with the first and second hinges;

wherein the slider has a protrusion, and a curved recess is formed on an outer surface of the second hinge, wherein the protrusion is slidably received in the curved recess;

wherein when the foldable electronic device is in a closed state, the input module, the display module, and the pivot member are parallel to each other, and the latch is joined in the opening to prevent the display module from rotating relative to the pivot member;

wherein when the display module and the pivot member are unfolded over a specific angle relative to the input module, the second hinge and the fixed assembly rotate around the first hinge, the second hinge is driven by the gears to rotate around the central axis, and the slider is forced by the second hinge to move and impel the latch to release from the opening, whereby the display module is rotatable relative to the pivot member.

8. The foldable electronic device as claimed in claim 7, further comprising a rod and a connecting member, wherein the rod extends through the slider, and the connecting member is connected to the rod and the second hinge.

9. The foldable electronic device as claimed in claim 8, wherein when the display module and the pivot member are unfolded over a specific angle relative to the input module from the closed state, the second hinge rotates around the central axis, and the protrusion slides along the curved recess and impels the slider to move along the rod.

* * * * *